United States Patent
Maangat

(10) Patent No.: US 7,064,576 B1
(45) Date of Patent: *Jun. 20, 2006

(54) TECHNIQUES FOR REDUCING LEAKAGE CURRENT IN ON-CHIP IMPEDANCE TERMINATION CIRCUITS

(75) Inventor: Simar Maangat, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/043,523

(22) Filed: Jan. 24, 2005

Related U.S. Application Data

(63) Continuation of application No. 10/645,788, filed on Aug. 20, 2003, now Pat. No. 6,859,064.

(51) Int. Cl.
*H03K 17/16* (2006.01)

(52) U.S. Cl. .......................................... 326/30; 326/83

(58) Field of Classification Search .................. 326/26, 326/27, 30, 82, 83, 87
See application file for complete search history.

(56) References Cited

U.S. PATENT DOCUMENTS

| | | | |
|---|---|---|---|
| 4,719,369 A | 1/1988 | Asano et al. |
| 4,954,729 A | 9/1990 | Urai |
| 5,111,081 A | 5/1992 | Atallah |
| 5,134,311 A | 7/1992 | Biber et al. |
| 5,164,663 A | 11/1992 | Alcorn |
| 5,179,300 A | 1/1993 | Rolandi et al. |
| 5,359,235 A | 10/1994 | Coyle et al. |
| 5,374,861 A | 12/1994 | Kubista |
| 5,592,510 A | 1/1997 | Van Brunt et al. |
| 5,602,494 A | 2/1997 | Sundstrom |
| 5,623,216 A | 4/1997 | Penza et al. |
| 5,726,582 A | 3/1998 | Hedberg |
| 5,726,583 A | 3/1998 | Kaplinsky |
| 5,764,080 A | 6/1998 | Huang et al. |
| 5,864,715 A | 1/1999 | Zani et al. |
| 5,939,896 A | 8/1999 | Hedberg |
| 5,955,911 A | 9/1999 | Drost et al. |
| 5,970,255 A | 10/1999 | Tran et al. |
| 6,008,665 A | 12/1999 | Kalb et al. |
| 6,026,456 A | 2/2000 | Ilkbahar |
| 6,037,798 A | 3/2000 | Hedberg |
| 6,049,255 A | 4/2000 | Hagberg et al. |
| 6,064,224 A | 5/2000 | Esch, Jr. et al. |
| 6,087,847 A | 7/2000 | Mooney et al. |

(Continued)

OTHER PUBLICATIONS

Altera, Apex 20K "Programmable Logic Device Family," Altera Corporation, Ver. 1.1, May 2001.

(Continued)

*Primary Examiner*—Don Le
(74) *Attorney, Agent, or Firm*—Townsend and Townsend and Crew, LLP

(57) ABSTRACT

Techniques for reducing the leakage currents through on-chip impedance termination circuits are provided. An on-chip impedance termination circuit includes a network of resistors and transistors formed on an integrated circuit. The termination circuit is coupled to one or more IO pins. The transistors can be turned ON and OFF to couple or decouple subsets of the resistors from the IO pins. The bodies of transistors 305–306 are coupled to a supply voltage to cut off leakage current. By pulling the body of these transistors to a supply voltage, the transistor's drain/source-to-body diodes turn OFF preventing unwanted leakage current. Also, by moving the source/drain/body node of transistors 301–304 to Node 2, leakage currents through transistors 301–304 are eliminated.

35 Claims, 4 Drawing Sheets

U.S. PATENT DOCUMENTS

| | | | |
|---|---|---|---|
| 6,097,208 | A | 8/2000 | Okajima et al. |
| 6,100,713 | A | 8/2000 | Kalb et al. |
| 6,118,310 | A | 9/2000 | Esch, Jr. |
| 6,147,520 | A | 11/2000 | Kothandaraman et al. |
| 6,154,060 | A | 11/2000 | Morriss |
| 6,157,206 | A | 12/2000 | Taylor et al. |
| 6,181,157 | B1 | 1/2001 | Fiedler |
| 6,236,231 | B1 | 5/2001 | Nguyen |
| 6,252,419 | B1 | 6/2001 | Sung et al. |
| 6,329,836 | B1 | 12/2001 | Drost et al. |
| 6,356,106 | B1 | 3/2002 | Greeff et al. |
| 6,362,644 | B1 | 3/2002 | Jeffery et al. |
| 6,366,128 | B1 | 4/2002 | Ghia et al. |
| 6,411,126 | B1 | 6/2002 | Tinsley et al. |
| 6,414,512 | B1 | 7/2002 | Moyer |
| 6,424,169 | B1 | 7/2002 | Partow et al. |
| 6,433,579 | B1 | 8/2002 | Wang et al. |
| 6,445,245 | B1 | 9/2002 | Schultz et al. |
| 6,448,813 | B1 | 9/2002 | Garlepp et al. |
| 6,466,063 | B1 | 10/2002 | Chen |
| 6,489,837 | B1 | 12/2002 | Schultz et al. |
| 6,504,397 | B1 | 1/2003 | Hart et al. |
| 6,586,964 | B1 | 7/2003 | Kent et al. |
| 6,590,413 | B1 | 7/2003 | Yang |
| 6,603,329 | B1 | 8/2003 | Wang et al. |
| 6,639,397 | B1 | 10/2003 | Roth et al. |
| 6,642,741 | B1 | 11/2003 | Metz et al. |
| 6,686,772 | B1 | 2/2004 | Li et al. |
| 6,710,618 | B1 | 3/2004 | Murray |
| 6,766,155 | B1 | 7/2004 | Salcido et al. |
| 6,815,980 | B1 * | 11/2004 | Kerr ............................ 326/30 |
| 6,859,064 | B1 | 2/2005 | Maangat |
| 2002/0010853 | A1 | 1/2002 | Trimberger et al. |
| 2002/0060602 | A1 | 5/2002 | Ghia et al. |
| 2002/0101278 | A1 | 8/2002 | Schultz et al. |
| 2003/0062922 | A1 | 4/2003 | Douglass et al. |
| 2004/0008054 | A1 | 1/2004 | Lesea et al. |

OTHER PUBLICATIONS

Altera, Apex II "Programmable Logic Device Family,"Altera Corporation, Ver. 1.1, May 2001.

Bendak, M. et al. (1996). "CMOS VLSI Implementation of Gigabyte/second computer network links," Dept. of Electrical and Computer Engineering, University of California at San Diego, La Jolla, CA 92093-0407, IEEE International Symposium on Circuits and Systems pp. 269-272, no month.

Boni, A. et al. (2001). "LVDS I/O Interface for Gb/s-per-Pin Operation in 0.35-um CMOS," IEEE Journal of Solid-State Circuits, 38(4):706-711, no month.

Esch and Manley, Theory and Design of CMOS HSTL I/O Pads, The Hewlett Packard Journal, Aug. 1998.

Xilinx, "Spartan-3 1.2V FPGA Family: Functional Description," Xilinx, DS099-2 (v1.2) Jul. 11, 2003.

Xilinx, "Virtex-II 1.5V Field Programmable Gate Arrays," Xilinx, DSO3102 (v1.5), Apr. 2, 2001.

Xilinx, "Virtex-II Platform FPGAs: Detailed Description," Xilinx, DS031-2 (v3.1) Oct. 14, 2003.

Xilinx, "Virtex-II Pro Platform FPGAs: Functional Description," Xilinx, DS083-2 (v2.9) Oct. 14, 2003.

* cited by examiner

TECHNIQUES FOR REDUCING LEAKAGE CURRENT IN ON-CHIP IMPEDANCE TERMINATION CIRCUITS

CROSS-REFERENCES TO RELATED APPLICATIONS

This application is a continuation of U.S. patent application Ser. No. 10/645,788 filed Aug. 20, 2003 now U.S. Pat. No. 6,859,064, which is incorporated by reference herein.

BACKGROUND OF THE INVENTION

The present invention relates to techniques for reducing leakage current, and more particularly, to techniques for reducing leakage current through transistors in an on-chip impedance termination circuit.

Integrated circuits have input/output (IO) pins that are used to transmit signals into and out of the circuit. An external termination resistor is usually coupled to each IO pin to provide impedance termination. An impedance termination resistor reduces reflection of input signals on a signal line coupled to an IO pin. Signal reflection causes signal distortion and degrades overall signal quality.

The use of external resistors for termination purposes can be cumbersome and costly, especially for integrated circuits that have numerous IO pins. For example, external resistors typically use a substantial amount of board space. As a result, on-chip impedance termination techniques have been developed, because they occupy less board space.

Prior art integrated circuits have provided on-chip impedance termination by coupling a field-effect transistor to an IO pin. The gate voltage of the transistor is controlled by a calibration circuit to regulate the impedance of the on-chip transistor. On-chip transistors have also been applied across differential IO pins to provide impedance termination.

However, transistors that control on-chip impedance termination circuits can leak unwanted current through their drain/source-to-body diodes even when the transistors are disabled. Therefore, it would be desirable to provide on-chip impedance termination circuits that have reduced leakage current.

BRIEF SUMMARY OF THE INVENTION

The present invention provides techniques for reducing the leakage current through on-chip impedance termination circuits. An on-chip impedance termination circuit of the present invention includes a network of resistors and transistors formed on an integrated circuit. The impedance termination circuit is coupled to one or more IO pins. The transistors can be turned ON and OFF to couple or decouple one or more of the resistors from the IO pins.

According to the present invention, all of the current paths in the impedance termination circuit are directed through a subset of the transistors (e.g., 2 transistors). The body region of each of the subset of transistors is coupled to a supply voltage to cut off leakage current. By pulling the body regions of these transistors to a supply voltage, their drain/source-to-body diodes are turned OFF to prevent unwanted leakage current. The body connection of the remaining transistors is changed such that junction leakage currents through these transistors are also eliminated.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
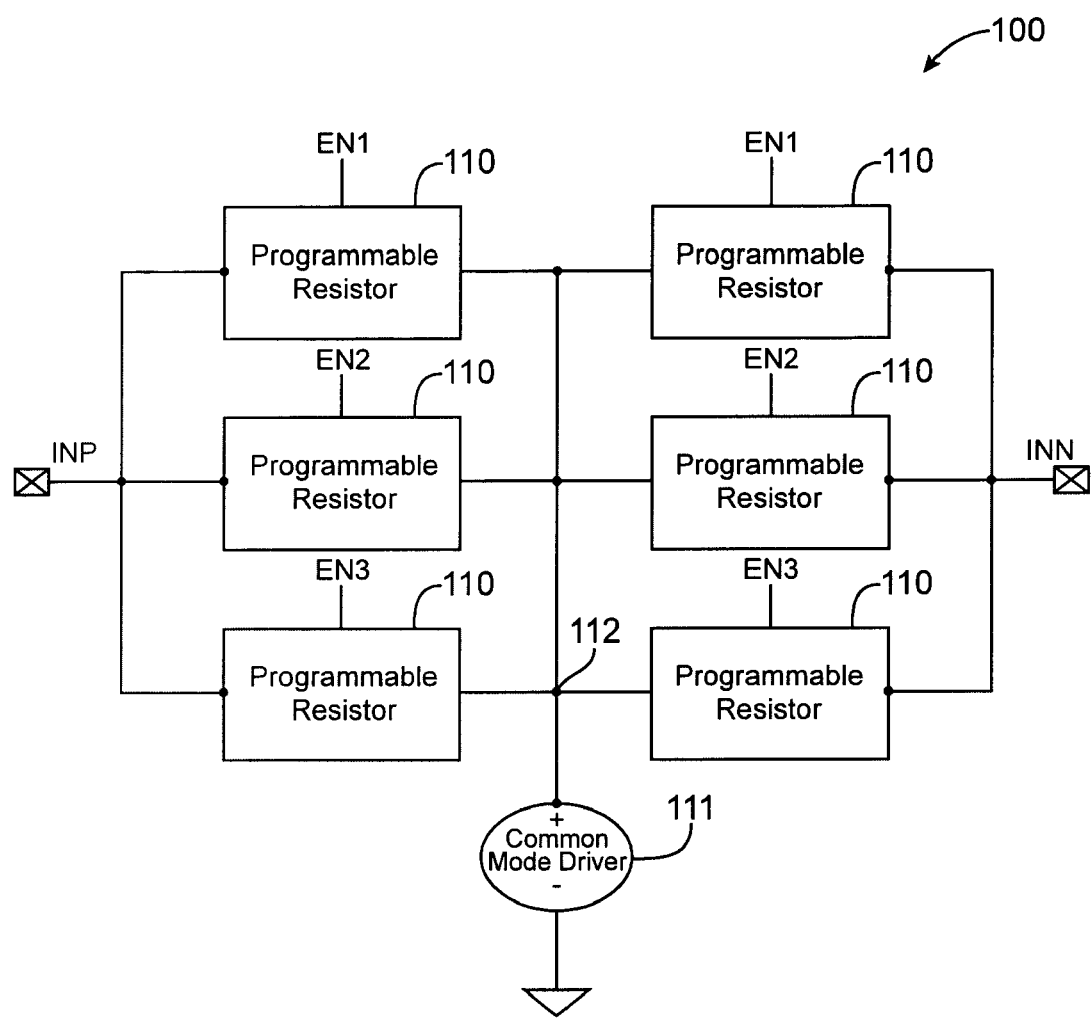
FIG. 1 illustrates a block diagram of an on-chip impedance termination circuit according to an embodiment of the present invention.

FIG. 1 illustrates an on-chip programmable termination impedance circuit 100 according to an embodiment of the present invention. Termination impedance circuit 100 is formed on an integrated circuit such as an application specific integrated circuit (ASIC), a programmable logic device (PLD), a field programmable gate array (FPGA), a programmable gate array (PLA), or a configurable logic array.

Termination impedance circuit 100 is coupled between two differential input/output (IO) pins INP and INN. IO pins INN and INP are driven by driver circuitry (not shown) between two supply voltage levels. The two supply voltage levels include a high supply voltage, VCC, and a low supply voltage, Ground.

Termination impedance circuit 100 provides impedance termination to transmission lines coupled to IO pins INN and INP. Termination impedance circuit 100 can also provide impedance matching to transmission lines coupled to IO pins INN and INP. The impedance of circuit 100 can be set to match the impedance of the transmission lines to reduce signal reflection.

Termination impedance circuit 100 includes programmable resistor circuits 110, which are discussed in further detail below. A user of the integrated circuit can program programmable resistor circuits 110 to provide a desired termination resistance value across IO pins INN and INP.

Termination impedance circuit 100 also includes common mode driver circuit 111. Common mode driver 111 generates a common mode voltage at node 112. The common mode voltage is in between the high supply voltage VCC and the low supply voltage Ground.

Figure 2:
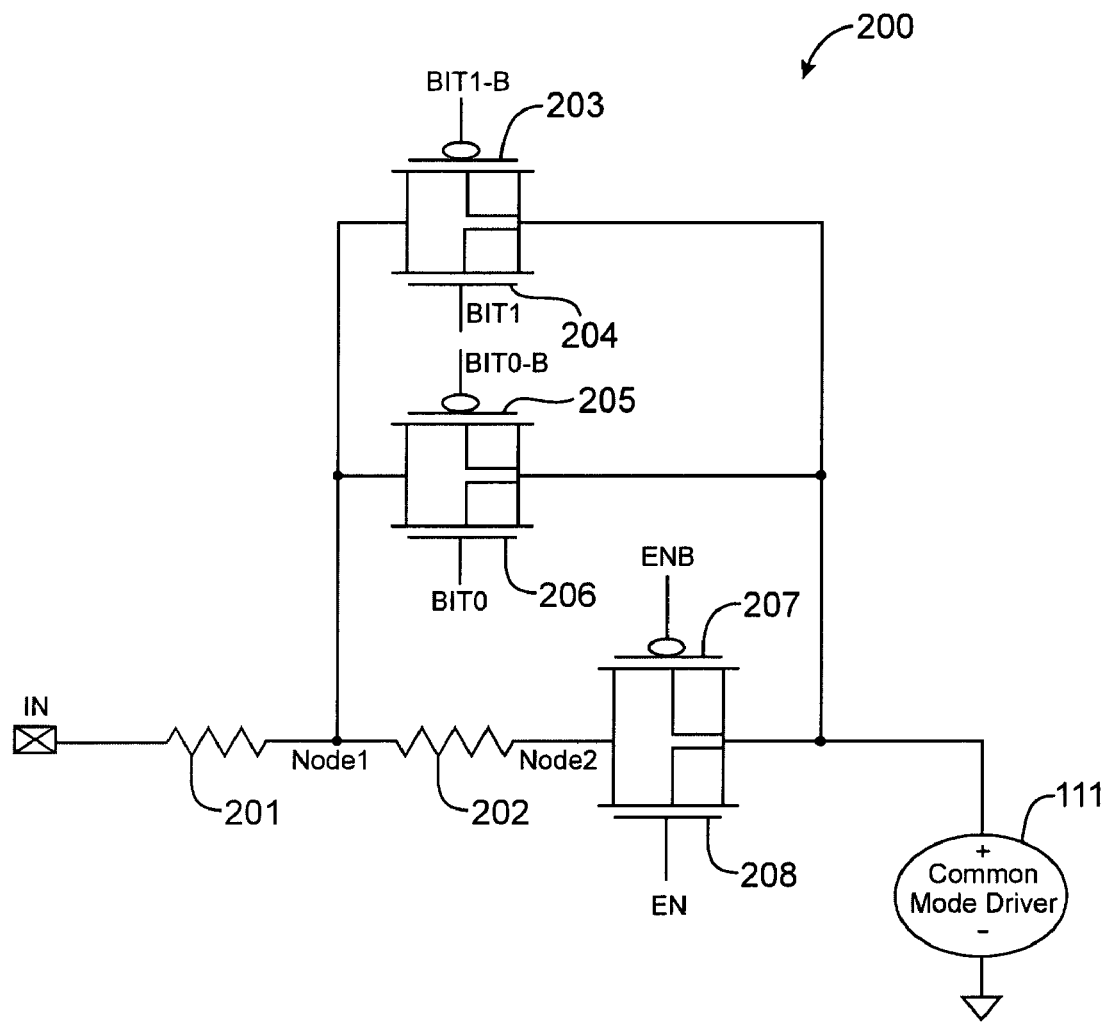
FIG. 2 illustrates a schematic of an on-chip impedance termination circuit that can conduct unwanted leakage current.

An example of impedance termination circuit 100 is illustrated in FIG. 2. FIG. 2 illustrates an on-chip programmable termination circuit 200. Circuit 200 includes field-effect transistors 203, 204, 205, 206, 207, and 208, and resistors 201–202. Circuit 200 is coupled to an IO pin IN. Pin IN can be pin INN or pin INP.

N-channel transistor 204 and p-channel transistor 203 form a first pass gate that is controlled by signal BIT1 and its compliment BIT1_B. N-channel transistor 206 and p-channel transistor 205 form a second pass gate that is controlled by signal BIT0 and its compliment BIT0_B.

N-channel transistor 208 and p-channel transistor 207 form a third pass gate that is controlled by enable signal EN and its compliment ENB.

When transistors 207 and 208 are ON, current flows through resistors 201–202 between pin IN and common mode driver 111. When transistors 203/204 or transistors 205/206 are ON, current flows through resistor 201 between pin IN and common mode driver 111. Turning transistors 203/204 or transistors 205/206 ON provides an alternate current path around resistor 202 that reduces the net resistance of circuit 200.

Transistors 203–208 are turned OFF to block the flow of current between pin IN and common mode driver 111. However, even when transistors 203–208 are OFF, unwanted leakage current can flow between pin IN and common mode driver 111. The body (i.e., bulk) regions of each of transistors 203–208 are coupled to common mode driver circuit 111.

When the voltage on pin IN is near supply voltage VCC, unwanted leakage current flows through the drain/source-to-body diodes of p-channel transistors 203, 205, and 207. When the voltage on pin IN is near ground, unwanted leakage current flows through the drain/source-to-body diodes of n-channel transistors 204, 206, and 208. The leakage current causes unnecessary power consumption.

The leakage current also causes inaccurate termination resistance. For example, if in FIG. 1, two of the resistors blocks (110) are turned off using enable signal EN, in order to get a higher termination resistance because fewer blocks 110 are in parallel with each other. However, there can be a leakage current flowing through the body regions of transistors 203–208 in the blocks 110 that are supposed to be shut off. The resistor blocks 110 that are supposed to be shut off are not completely OFF for high input signal swings. That means the resistive paths through those blocks 110 are not actually an open circuit and are contributing to the overall impedance, which causes an inaccurate termination impedance.

Figure 3:
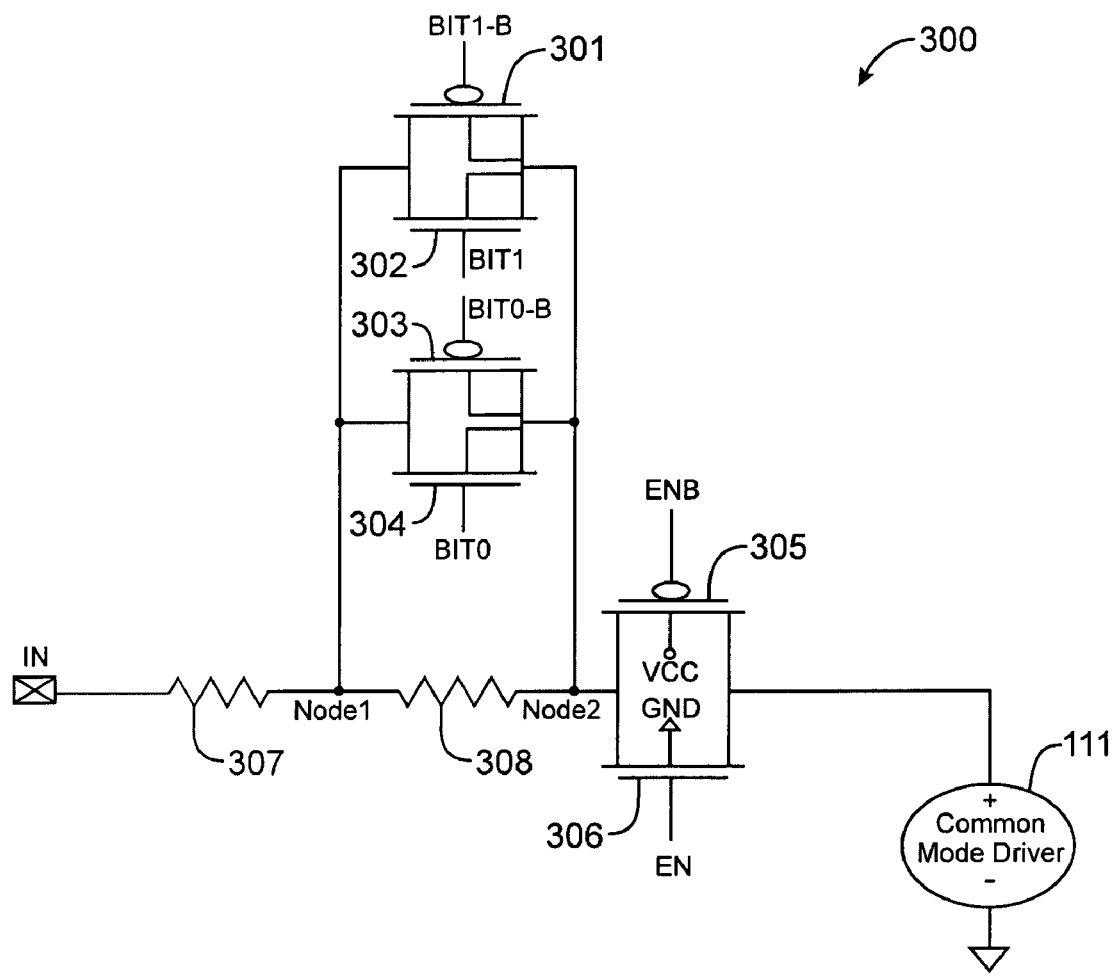
FIG. 3 illustrates a schematic of an on-chip impedance termination circuit that prevents unwanted leakage current according to an embodiment of the present invention.

Impedance termination circuits of the present invention block the unwanted leakage current through transistors in programmable termination resistor circuits 110. FIG. 3 illustrates an embodiment of an impedance termination circuit 300 of the present invention. Circuit 300 is an example of programmable resistor circuits 110 in FIG. 1.

Circuit 300 includes field-effect transistors 301, 302, 303, 304, 305, 306, and resistors 307–308. N-channel transistor 302 and p-channel transistor 301 form a first pass gate that is controlled by signal BIT1 and its compliment BIT1_B. N-channel transistor 304 and p-channel transistor 303 form a second pass gate that is controlled by signal BIT0 and its compliment BIT0_B. N-channel transistor 306 and p-channel transistor 305 form a third pass gate that is controlled by enable signal EN and its compliment ENB. Signals BIT0, BIT1, BIT0_B, BIT1_B, EN, and ENB can be generated by memory or logic elements on a field programmable gate array. Pass gate 305/306 is turned ON to enable impedance termination circuit 300, and turned OFF to disable circuit 300.

Transistors 301–304 are coupled across both terminals of resistor 308 as shown in FIG. 3. Therefore, transistors 301–304 cannot bypass the current paths through transistors 305–306. Thus, when transistors 305/306 are both OFF, current flow between pin IN and common mode driver 111 is blocked. When transistors 305/306 are ON, current can flow between pin IN and common mode driver circuit 111.

Transistors 301–304 are coupled in parallel with resistor 308. One or more of transistors 301–304 can be turned ON to modulate the termination resistance provided by circuit 300.

The body regions of transistors 305–306 are coupled to a supply voltage as shown in FIG. 3. The body of P-channel transistor 305 is coupled to the high supply voltage VCC. The body of N-channel transistor 306 is coupled to ground (the low supply voltage).

The drain/source-to-body diode (also called the body diode) within p-channel transistor 305 includes a P-N junction between the drain (or source) region and the body region of the transistor. Coupling the N-type body region to VCC prevents the drain/source-to-body diode from becoming forward biased when the voltage at pin IN is near VCC. Therefore, leakage current cannot flow through the drain/source-to-body diode of transistor 305 when transistor 305 is OFF.

The drain/source-to-body diode within n-channel transistor 306 also includes a P-N junction between the drain (or the source) region and the body region of the transistor. Coupling the P-type body region to ground prevents the drain/source-to-body diode from becoming forward biased when the voltage at pin IN is near ground. Therefore, leakage current cannot flow through the drain/source-to-body diode of transistor 306 when transistor 306 is OFF.

When transistors 305 and 306 are OFF, current flow between pin IN and common mode driver 111 is completely blocked. No leakage current flows through the channels or the body diodes of transistors 305 and 306.

According to the present invention, all of the current paths in impedance termination circuit 300 are directed through transistors 305 and 306, and the body diodes of transistors 305–306 are prevented from becoming forward biased. By coupling the body regions of transistors 305–306 to supply voltages VCC and ground, respectively, the body diodes of transistors 305–306 are prevented from conducting leakage current through circuit 300.

In FIG. 2, the drain/source/body terminals of transistors 203–206 are coupled to common mode driver 111. According to the present invention, the drain/source/body terminals of transistors 301–304 are coupled to node 2 as shown in FIG. 3. By coupling the drain/source/body terminals of transistors 301–304 to node 2, leakage current cannot flow through the source/drain/body diodes of transistors 301–304 when these transistors are OFF. This is because Node 2 gets pulled to the same potential as the pin when this resistor is OFF, i.e., when all transistors 301–306 are shut off. With this configuration, the junction voltage across source/body or drain/body diodes of 301–304 is almost zero when the resistor is OFF, which eliminates the junction leakage currents. This was not the case in FIG. 2, in which there was leakage through the diode junctions when the resistor was OFF.

The present invention provides techniques for blocking leakage current in on-chip impedance termination circuits to reduce power consumption. The body of transistor 305 is pulled up to supply voltage VCC. Circuit 300 substantially reduces the net power consumption by blocking the body diode leakage currents.

In FIG. 3, each of the impedance termination circuits 110 of FIG. 1 can include the circuitry 300 shown in FIG. 3. Thus, there are three pass gates 305/306 and three sets of termination resistors 307/308 coupled between common mode driver 111 and pin INP in circuit 100. There are also three pass gates 305/306 and three sets of termination resistors 307/308 coupled between common mode driver 111 and pin INN in circuit 100.

FIG. 3 illustrates merely one embodiment of the present invention. As will be understood by one of skill in the art, the present invention includes many other embodiments. For example, an impedance termination circuit 110 of the present invention can include one termination resistor. Impedance termination circuit 110 can also include three or more termination resistors. The present invention can also include more pass gates or single transistors that are coupled in parallel with the additional termination resistors.

The present invention also includes integrated circuits that have more or less than 6 termination impedance circuits 110. The present invention includes circuits that apply on-chip impedance termination to one pin or to two differential pins.

Figure 4:
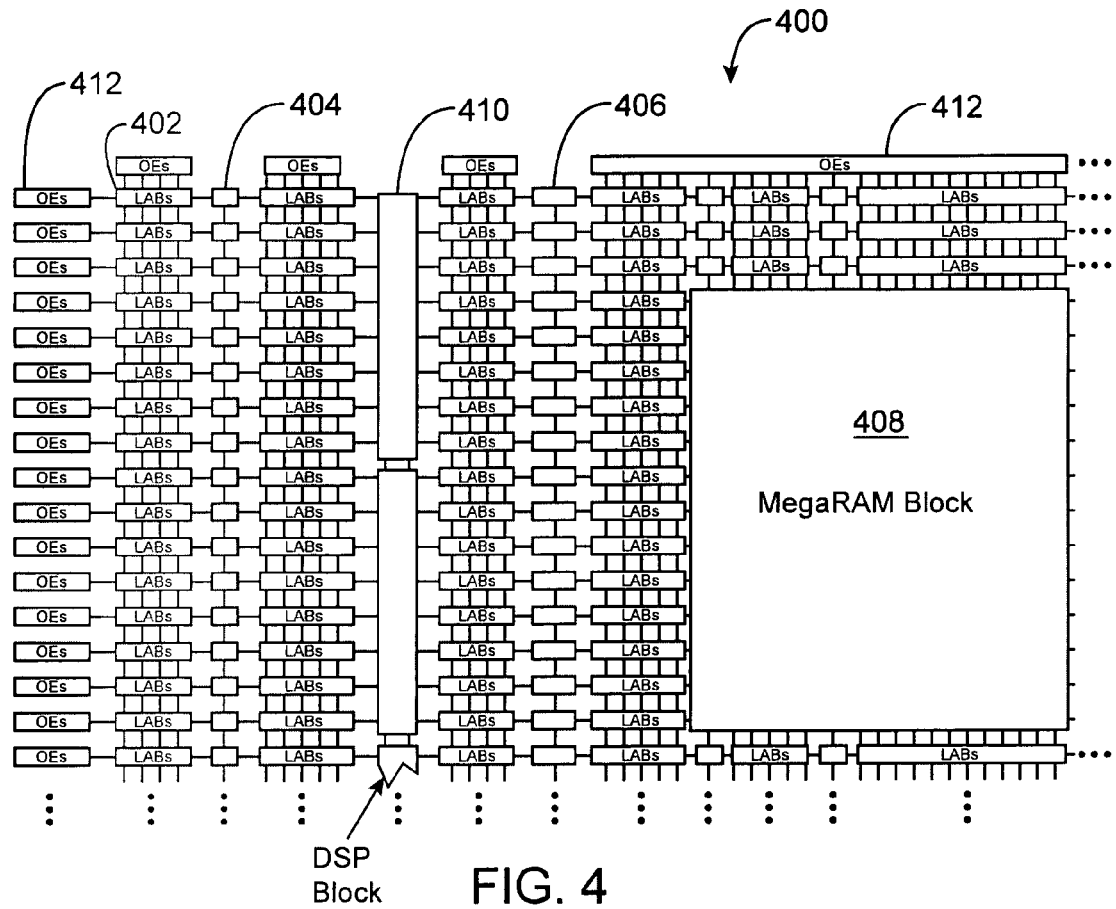
FIG. 4 is a simplified block diagram of a programmable logic device that can implement embodiments of the present invention.

FIG. 4 is a simplified partial block diagram of an exemplary high-density PLD/FPGA 400 wherein techniques according to the present invention can be utilized. PLD 400 includes a two-dimensional array of programmable logic array blocks (or LABs) 402 that are interconnected by a network of column and row interconnects of varying length and speed. LABs 402 include multiple (e.g., 10) logic elements (or LEs), an LE being a small unit of logic that provides for efficient implementation of user defined logic functions.

PLD 400 also includes a distributed memory structure including RAM blocks of varying sizes provided throughout the array. The RAM blocks include, for example, 512 bit blocks 404, 4K blocks 406 and a MegaBlock 408 providing 512K bits of RAM. These memory blocks may also include shift registers and FIFO buffers. PLD 400 further includes digital signal processing (DSP) blocks 410 that can implement, for example, multipliers with add or subtract features. I/O elements (IOEs) 412 located, in this example, around the periphery of the device support numerous single-ended and differential I/O standards. It is to be understood that PLD 400 is described herein for illustrative purposes only and that the present invention can be implemented in many different types of PLDs, FPGAs, and the like.

Figure 5:
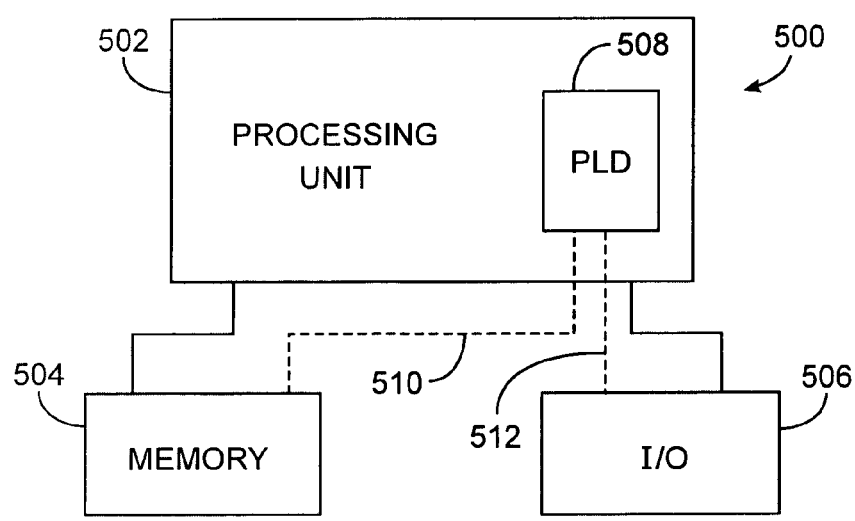
FIG. 5 is a block diagram of an electronic system that can implement embodiments of the present invention.

While PLDs of the type shown in FIG. 4 provide many of the resources required to implement system level solutions, the present invention can also benefit systems wherein a PLD is one of several components. FIG. 5 shows a block diagram of an exemplary digital system 500, within which the present invention may be embodied. System 500 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, system 500 may be provided on a single board, on multiple boards, or within multiple enclosures.

System 500 includes a processing unit 502, a memory unit 504 and an I/O unit 506 interconnected together by one or more buses. According to this exemplary embodiment, a programmable logic device (PLD) 508 is embedded in processing unit 502. PLD 508 may serve many different purposes within the system in FIG. 5. PLD 508 can, for example, be a logical building block of processing unit 502, supporting its internal and external operations. PLD 508 is programmed to implement the logical functions necessary to carry on its particular role in system operation. PLD 508 may be specially coupled to memory 504 through connection 510 and to I/O unit 506 through connection 512.

Processing unit 502 may direct data to an appropriate system component for processing or storage, execute a program stored in memory 504 or receive and transmit data via I/O unit 506, or other similar function. Processing unit 502 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 508 can control the logical operations of the system. In an embodiment, PLD 508 acts as a reconfigurable processor, which can be reprogrammed as needed to handle a particular computing task. Alternately, programmable logic device 508 may itself include an embedded microprocessor. Memory unit 504 may be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications can be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. An integrated circuit comprising a first impedance termination circuit, the first impedance termination circuit comprising:
    a first termination impedance coupled in series with a first pin of the integrated circuit; and
    a first transistor coupled in series with the first termination impedance, the first transistor having a body, a first current-carrying terminal coupled to the first termination impedance, a second current-carrying terminal, and an enable terminal, wherein when the enable terminal is biased to turn the first transistor OFF, the body of the first transistor is biased to block current flow through the first termination impedance and the first pin.

2. The integrated circuit according to claim 1, wherein the first transistor comprises a N-channel MOSFET with the body of the first transistor biased to ground.

3. The integrated circuit according to claim 1, wherein the first transistor comprises a P-channel MOSFET with the body of the first transistor biased to a supply voltage.

4. The integrated circuit according to claim 1, wherein the first termination impedance comprises a first termination resistor coupled in series between the first pin and the first current-carrying terminal.

5. The integrated circuit according to claim 4, wherein the first termination impedance comprises a second termination resistor coupled in series between the first pin and the first termination resistor.

6. The integrated circuit according to claim 4, wherein the first termination impedance comprises a third transistor coupled in parallel to the first termination resistor.

7. The integrated circuit according to claim 6, wherein the first termination impedance comprises a fourth transistor coupled in parallel to the first termination resistor.

8. The integrated circuit according to claim 1, further comprising a second transistor coupled in parallel with the first transistor, the second transistor comprising a body, a first current-carrying terminal coupled to the first termination impedance, a second current-carrying terminal, and an enable terminal, wherein when the enable terminal of the second transistor is biased to turn the second transistor OFF, the body of the second transistor is biased to block current flow through the first termination impedance and the first pin.

9. The integrated circuit according to claim 8, wherein the second transistor comprises a N-channel MOSFET with the body of the second transistor biased to ground.

10. The integrated circuit according to claim 8, wherein the second transistor comprises a P-channel MOSFET with the body of the second transistor biased to a supply voltage.

11. The integrated circuit according to claim 8, wherein the second current-carrying terminal of the first transistor and the second current-carrying terminal of the second transistor are coupled to a common mode driver, wherein the common mode driver is configured to generate a common mode voltage output in response to signals received from the second current-carrying terminal of the first transistor and the second current-carrying terminal of the second transistor.

12. The integrated circuit according to claim 1, further comprising:
a second termination impedance coupled to a second pin of the integrated circuit; and
a second transistor coupled in series with the second termination impedance, the second transistor comprising a body, a first current-carrying terminal coupled to the second termination impedance, a second current-carrying terminal, and an enable terminal, wherein when the enable terminal of the second transistor is biased to turn the second transistor OFF, the body of the second transistor is biased to block current flow through the second termination impedance.

13. The integrated circuit according to claim 12, wherein the second transistor comprises a N-channel MOSFET with the body of the second transistor biased to ground.

14. The integrated circuit according to claim 12, wherein the second transistor comprises a P-channel MOSFET with the body of the second transistor biased to a supply voltage.

15. The integrated circuit according to claim 12, wherein the second termination impedance comprises a first termination resistor coupled in series between the first current carrying terminal of the second transistor and the second pin.

16. The integrated circuit according to claim 15, wherein the second termination impedance comprises a second termination resistor coupled in series between the first termination resistor and the second pin.

17. The integrated circuit according to claim 16, wherein the second termination impedance comprises a third transistor coupled in parallel to the first termination resistor.

18. The integrated circuit according to claim 17, wherein the second termination impedance comprises a fourth transistor coupled in parallel to the first termination resistor.

19. The integrated circuit according to claim 12, further comprising a third transistor coupled in parallel with the second transistor, the third transistor comprising a body, a first current-carrying terminal coupled to the second termination impedance, a second current-carrying terminal, and an enable terminal, wherein when the enable terminal of the third transistor is biased to turn the third transistor OFF, the body of the third transistor is biased to block current flow through the second termination impedance.

20. The integrated circuit according to claim 19, wherein the third transistor comprises a N-channel MOSFET with the body of the third transistor biased to ground.

21. The integrated circuit according to claim 19, wherein the third transistor comprises a P-channel MOSFET with the body of the third transistor biased to a supply voltage.

22. The integrated circuit according to claim 19, wherein the second current-carrying terminal of the second transistor and the second current-carrying terminal of the third transistor are coupled to a common mode driver, wherein the common mode driver is configured to generate a common mode voltage output in response to signals received from the second current-carrying terminal of the second transistor and the second current-carrying terminal of the third transistor.

23. An integrated circuit comprising:
a first programmable resistor coupled in series between a first pin and a common node, wherein the first programmable resistor includes a first transistor having a body, wherein when the first transistor is biased OFF, the body of the first transistor is biased to block current flow through the first programmable resistor; and
a second programmable resistor coupled in series between a second pin and the common node, wherein the second programmable resistor includes a second transistor having a body, wherein when the second transistor is biased OFF, the body of the second transistor is biased to block current flow through the second programmable resistor.

24. The integrated circuit according to claim 23, wherein the common node is coupled to a common mode driver, wherein the common mode driver is configured to generate a common mode voltage output in response to signals received from the common node.

25. The integrated circuit according to claim 23, further comprising a third programmable resistor coupled in parallel with the first programmable resistor, wherein the third programmable resistor includes a third transistor having a body, wherein when the third transistor is biased OFF, the body of the third transistor is biased to block current flow through the third programmable resistor.

26. The integrated circuit according to claim 23, further comprising a fourth programmable resistor coupled in parallel with the second programmable resistor, wherein the fourth programmable resistor includes a fourth transistor having a body, wherein when the fourth transistor is biased OFF, the body of the fourth transistor is biased to block current flow through the fourth programmable resistor.

27. The integrated circuit according to claim 23, wherein the first programmable resistor comprises a termination impedance coupled in series between the first pin and a current-carrying terminal of the first transistor.

28. The integrated circuit according to claim 27, wherein the termination impedance comprises at least a third transistor configured to selectively adjust the termination impedance of the first pin.

29. The integrated circuit according to claim 23, wherein the second programmable resistor comprises a termination impedance coupled in series between the second pin and a current-carrying terminal of the second transistor.

30. The integrated circuit according to claim 29, wherein the termination impedance comprises at least a third transistor configured to selectively adjust the termination impedance of the second pin.

31. A method of operating a termination circuit comprising:
   providing a termination impedance in series with a field effect transistor and an input/output pin; and
   biasing a body of the field effect transistor to prevent current flow through the termination impedance and the input/output pin when the field effect transistor is biased to an OFF state.

32. The method according to claim 31, wherein biasing the body comprises when the field effect transistor is a P-channel MOSFET coupling the body to a supply voltage.

33. The method according to claim 31, wherein biasing the body comprises when the field effect transistor is a N-channel MOSFET coupling the body to a ground potential.

34. The method according to claim 31, wherein the providing the termination impedance comprises selecting one or more field effect transistors coupled in parallel with a termination resistor coupled in series with the field effect transistor.

35. The method according to claim 31, wherein biasing the body comprises biasing a body diode to an OFF condition when the field effect transistor is biased to the OFF state.

* * * * *